(12) United States Patent
Vanderhoek et al.

(10) Patent No.: US 8,643,399 B1
(45) Date of Patent: Feb. 4, 2014

(54) ASYMMETRIC SIGNAL ROUTING IN A PROGRAMMABLE LOGIC DEVICE

(75) Inventors: Tim Vanderhoek, Toronto (CA); Michael Chan, Scarborough (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/229,567

(22) Filed: Sep. 9, 2011

(51) Int. Cl.
  *H01L 25/00* (2006.01)
(52) U.S. Cl.
  USPC .......................................... 326/41
(58) Field of Classification Search
  USPC .............................. 326/37–47, 101
  See application file for complete search history.

(56) References Cited

U.S. PATENT DOCUMENTS

2005/0231236 A1* 10/2005 Vest et al. ................ 326/41

\* cited by examiner

*Primary Examiner* — Thienvu Tran (57) ABSTRACT

A programmable logic device includes an array of functional blocks and input/output elements disposed at the periphery of the programmable logic device. The programmable logic device also includes conductors configured to conduct signals between the functional blocks and between the functional blocks and the routing channels. The number of conductors that propagate signals in a direction toward the periphery and out of the array is greater than the number of conductors that propagate signals into the array in a direction away from the periphery.

20 Claims, 9 Drawing Sheets

602
TRANSMIT A FIRST PLURALITY OF SIGNALS VIA A FIRST PLURALITY OF CONDUCTORS THAT CONSISTS OF A FIRST NUMBER OF CONDUCTORS THAT PROPAGATE SIGNALS IN A DIRECTION AWAY FROM AN EDGE OF AN ARRAY OF FUNCTIONAL BLOCKS AND INTO A FUNCTIONAL BLOCK OF THE ARRAY

604
TRANSMIT A SECOND PLURALITY OF SIGNALS VIA A SECOND PLURALITY OF CONDUCTORS CONSISTING OF A SECOND NUMBER OF CONDUCTORS THAT PROPAGATE SIGNALS OUT OF THE FUNCTIONAL BLOCK IN A DIRECTION TOWARD THE EDGE OF THE ARRAY (THE SECOND NUMBER IS GREATER THAN THE FIRST NUMBER)

FIG. 6

ASYMMETRIC SIGNAL ROUTING IN A PROGRAMMABLE LOGIC DEVICE

BACKGROUND

A programmable logic device (PLD) is a configurable integrated circuit used to implement a custom logic function. Examples of PLDs include devices such as, but not limited to, a programmable logic array (PLA), a field programmable gate array (FPGA), and an erasable and complex PLD.

A basic building block of a PLD includes a logic element that is capable of performing logic functions on a number of input variables. Conventional PLDs combine large numbers of logic elements through an array of programmable interconnects to facilitate implementation of complex logic functions. PLDs are popular because of their combination of versatility and low cost.

The logic elements may be arranged in groups of eight, for example, to form larger functional blocks such as logic array blocks (LABs). The LABs are arranged in a two-dimensional array and are programmably connectable to each other. Conductors (lines or wires) in a PLD are used to route signals from one location on the PLD to another location on the PLD. Each functional block includes multiplexers and drivers that are used to drive signals between blocks.

More specifically, LAB conductors carry signals generated outside the LAB, local conductors carry signals generated by logic elements within the LAB, logic element input multiplexers programmably select inputs from the LAB conductors and local conductors and provide these as inputs to the logic elements that constitute the LAB, and logic element output multiplexers output signals of the logic elements to the local conductors or to the inputs of multiplexers that, together with corresponding drivers, drive the conductors outside the LAB. Other input multiplexers route signals from routing channels at the periphery of the LABs to the LAB conductors. Output multiplexers and drivers drive the outputs of a LAB (e.g., the outputs of the logic elements within the LAB) through the channels outside the LAB.

SUMMARY

Generally speaking, in a conventional PLD, the number of conductors available to carry signals from the periphery into the core of the LAB array and the number of conductors available to carry signals from the core into the periphery are the same. However, the number of signals that need to be connected from the periphery into the core is often less than the number of signals that need to be connected from the core into the periphery. Hence, some of the conductors from the periphery to the core are not necessary. Conventionally, the unnecessary conductors are permanently driven to Vcc and cannot be used to carry signals.

In embodiments according to the present invention, the unnecessary (unused) conductors are advantageously instead used to route signals from the core to the periphery. Thus, the number of conductors that propagate signals in a direction away from the core of the array and toward the periphery is greater than the number of conductors that propagate signals into the core in a direction away from the periphery.

More specifically, in one embodiment, a PLD includes: a first plurality of conductors that includes at least and not more than a first number of conductors that originate in a functional block and carry signals in a direction away from the periphery; a second plurality of conductors including at least and not more than a second number of conductors that originate outside the functional block and carry signals through the functional block in a direction away from the periphery; a third plurality of conductors including at least and not more than a third number of conductors that originate in the functional block and carry signals in a direction toward the periphery; and a fourth plurality of conductors including at least and not more than a fourth number of conductors that originate outside the functional block and carry signals through the functional block in a direction toward the periphery. The sum of the third and fourth numbers is greater than the sum of the first and second numbers.

In such an embodiment, the PLD can also include: a fifth plurality of conductors that originate outside the functional block and carry signals into the functional block in a direction away from the periphery; and a sixth plurality of conductors that originate outside the functional block and carry signals into the functional block in a direction toward the periphery.

By using the unnecessary conductors to carry signals from the core to the periphery, the number of signals carried from the core to the periphery can be advantageously increased without increasing the size of the PLD and also without adding conductors, multiplexers, and/or drivers. Accordingly, costs remain about the same and may be reduced relative to other solutions.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the embodiments of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
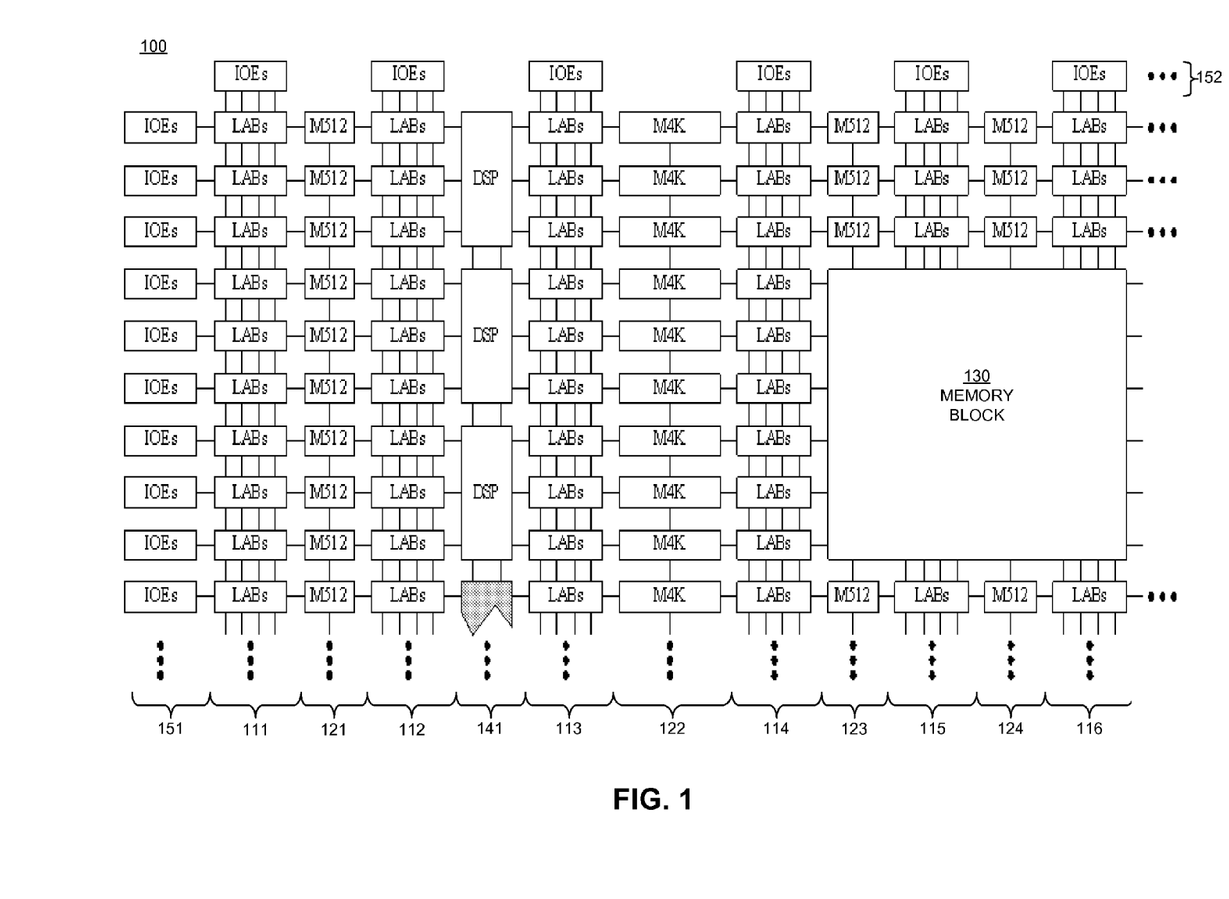
FIG. 1 is a block diagram showing an example of some of the components that are part of a programmable logic device in which embodiments according to the present invention can be implemented.

FIG. 1 is a block diagram showing an example of some of the components that are part of a programmable logic device (PLD) 100 in which embodiments according to the present invention can be implemented. The PLD 100 may be used to implement a field programmable gate array (FPGA), a complex programmable logic device (CPLD), a programmable logic array (PLA), or some other type of programmable logic device.

As shown in FIG. 1, the PLD 100 may include a plurality of programmable functional blocks, such as logic array blocks (LABs). In one embodiment, the LABs of the PLD 100 are arranged in rows and/or columns (e.g., as two-dimensional arrays). For example, the columns 111, 112, 113, 114, 115, and 116 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB.

As shown in the example of FIG. 1, the PLD 100 may include a plurality of memory blocks (e.g., memory block 130). In one embodiment, a memory block may include random access memory (RAM), where the RAM may be used to provide multi-port memory, dedicated true dual-port memory, simple dual-port memory, single-port memory, or some combination thereof. In one embodiment, a memory block may include at least one shift register, at least one first-in-first-out (FIFO) buffer, at least one flip-flop, some combination thereof, etc.

The memory blocks of the PLD 100 may be arranged in rows and/or columns (e.g., as two-dimensional arrays), in one embodiment. For example, the columns 121, 122, 123, and 124 may include one or more memory blocks. Alternatively, one or more memory blocks (e.g., memory block 130) may be located individually or in small groups (e.g., groups of two memory blocks, three memory blocks, etc.) in the PLD.

As shown in the example of FIG. 1, the PLD 100 may include a plurality of digital signal processing (DSP) blocks 141. The DSP blocks may provide digital signal processing functions such as finite impulse response (FIR) filtering, infinite impulse response (IIR) filtering, image processing, modulation (e.g., equalization, etc.), encryption, error correction, etc. The DSP blocks may offer other functionality such as accumulation, addition/subtraction, summation, etc.

The PLD 100 may include a plurality of input/output elements (IOEs). Each IOE may include at least one input buffer and/or at least one output buffer coupled to one or more pins of the PLD, where the pins may be external terminals separate from the die of the PLD. In one embodiment, an IOE may be used to communicate input signals, output signals, supply voltages, etc., between other components of the PLD and one or more external devices. In one embodiment, the IOEs may be located at the periphery of the PLD 100 (e.g., in column 151 and in row 152, as well as in the corresponding column and row along the other edges at the periphery).

In one embodiment, the PLD 100 may include routing resources. For example, the PLD 100 may include LAB local interconnect lines, row interconnect lines (e.g., "H-type wires"), column interconnect lines (e.g., "V-type wires"), etc., that may be used to route signals between components of the PLD 100.

Figure 2:
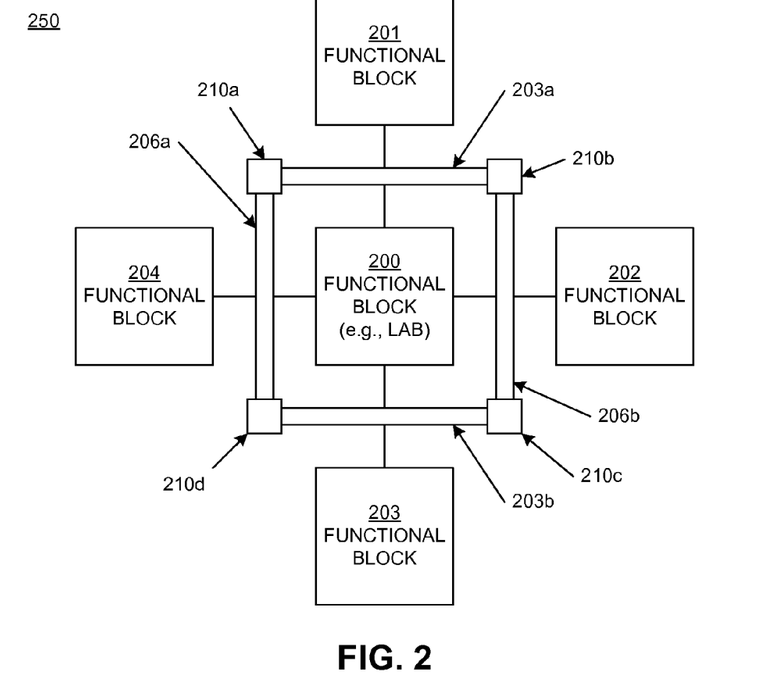
FIG. 2 is a block diagram showing an array of functional blocks in a programmable logic device in an embodiment according to the present invention.

FIG. 2 is a block diagram showing an array 250 of functional blocks (e.g., LABs) in an embodiment according to the present invention. FIG. 2 represents a software view of a device and is conceptual in nature. The routing channels 203a, 203b, 206a, and 206b are treated as part of the functional blocks in the figures following FIG. 2; that is, in some architectures, the routing channels may be physically located within a functional block. For example, a portion of each of the channels 203a, 203b, 206a, and 206b can correspond to the conductors 301-306 of FIG. 3. In the example of FIG. 2, the routing channels 203a and 203b run in the horizontal direction and so may be referred to as H-channels, and the routing channels 206a and 206b run in the vertical direction and so may be referred to as V-channels. The switches 210a, 210b, 210c, and 210d couple the H-channels and the V-channels.

The functional block 200 is coupled to all four of the routing channels and can transmit signals to and receive signals from the routing channels. Other functional blocks 201, 202, 203, and 204 may be located above and below the functional block 200, depending on the location of the functional block 200 in the array. The functional block 200 includes a number of multiplexers and drivers that can be used to send and receive signals to and from the routing channels; the multiplexers and drivers are described in conjunction with FIGS. 4A, 4B, and 4C, below.

Figure 3:
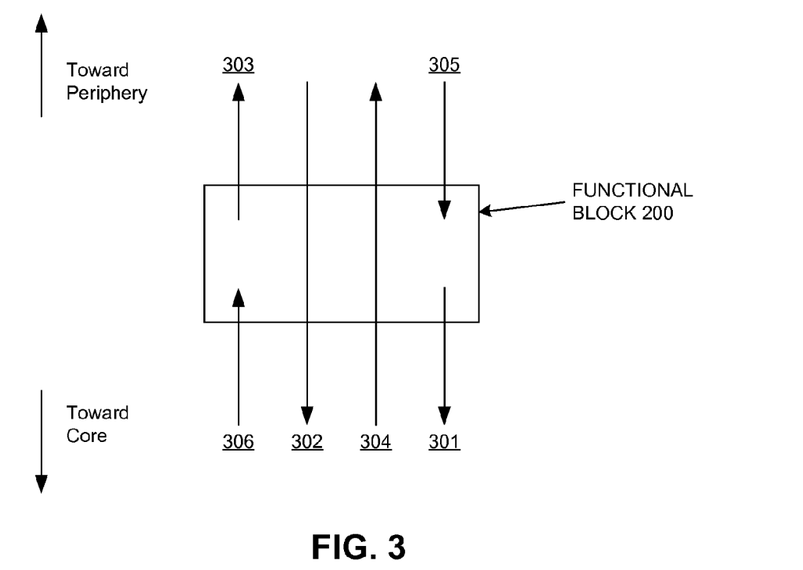
FIG. 3 is a block diagram illustrating conductors that route signals to, from, and through a functional block in embodiments according to the invention.

FIG. 3 is a block diagram illustrating conductors that route signals to, from, and through the functional block 200 in embodiments according to the invention. Only vertical conductors (V-type wires) are shown in the example of FIG. 3 for clarity of illustration; it is appreciated that there may be horizontal conductors in addition to the vertical conductors. Also, each of the illustrated conductors can actually represent a plurality of conductors. The functional block 200 of FIG. 3 may be located at the periphery of the array of functional blocks (e.g., at one of the edges of the array), or it may be located inside the array.

In one embodiment, the conductors include a first plurality of conductors 301 consisting of a first number (M1) of conductors that originate in the functional block 200 and carry signals in a direction away from the periphery and toward the core of the array. The conductors also include a second plurality of conductors 302 consisting of a second number (M2) of conductors that originate outside the functional block 200 and carry signals through the functional block in a direction away from the periphery. That is, the signals carried by the conductors 302 originate outside the functional block 200, traverse the functional block 200 without being acted on by the functional block, and continue to a destination (e.g., to another functional block) outside the functional block 200.

The conductors 302 (and also the conductors 304 presented below) may be referred to as conductors of length N or as length-N conductors, where N refers to the number of routing interfaces or channels traversed by the conductor. For example, a length-2 conductor begins in a first functional block, traverses a second functional block, and ends in a third functional block, thereby traversing two block boundaries. A length-2 conductor, for example, also "continuously" traverses the second functional block and conducts a signal "uninterrupted" through the second functional block. As used in this context, "continuously" means that the line or wire that defines the conductor is a continuous track of metal; the continuous track of metal is not separated into segments that are separated from each other by another element such as a multiplexer. As used in this context, "uninterrupted" means that a signal conducted on a continuous conductor is not acted upon by an intervening element such as a multiplexer. In other words, a continuous conductor and the uninterrupted signals it carries span the width or length of a functional block but are not inputs to that functional block; they simply pass through that functional block.

The conductors also include a third plurality of conductors 303 consisting of a third number (M3) of conductors that originate in the functional block 200 and carry signals in a direction toward the periphery. The conductors also include a fourth plurality of conductors 304 consisting of a fourth number (M4) of length-N conductors that originate outside the functional block 200 and carry signals through the functional block in a direction toward the periphery.

Significantly, the sum of the third and fourth numbers is greater than the sum of the first and second numbers; M3+M4>M1+M2. That is, in embodiments according to the present invention, the number of conductors that propagate signals in a direction away from the core of the array and toward the periphery of the array is greater than the number of conductors that propagate signals into the core in a direction away from the periphery. This can be generally referred to as asymmetric signal routing.

In one embodiment, the conductors also include a fifth plurality of conductors 305 that originate outside the functional block 200 and carry signals into the functional block in a direction away from the periphery, and a sixth plurality of conductors 306 that originate outside the functional block 200 and carry signals into the functional block in a direction toward the periphery.

Figure 4A:
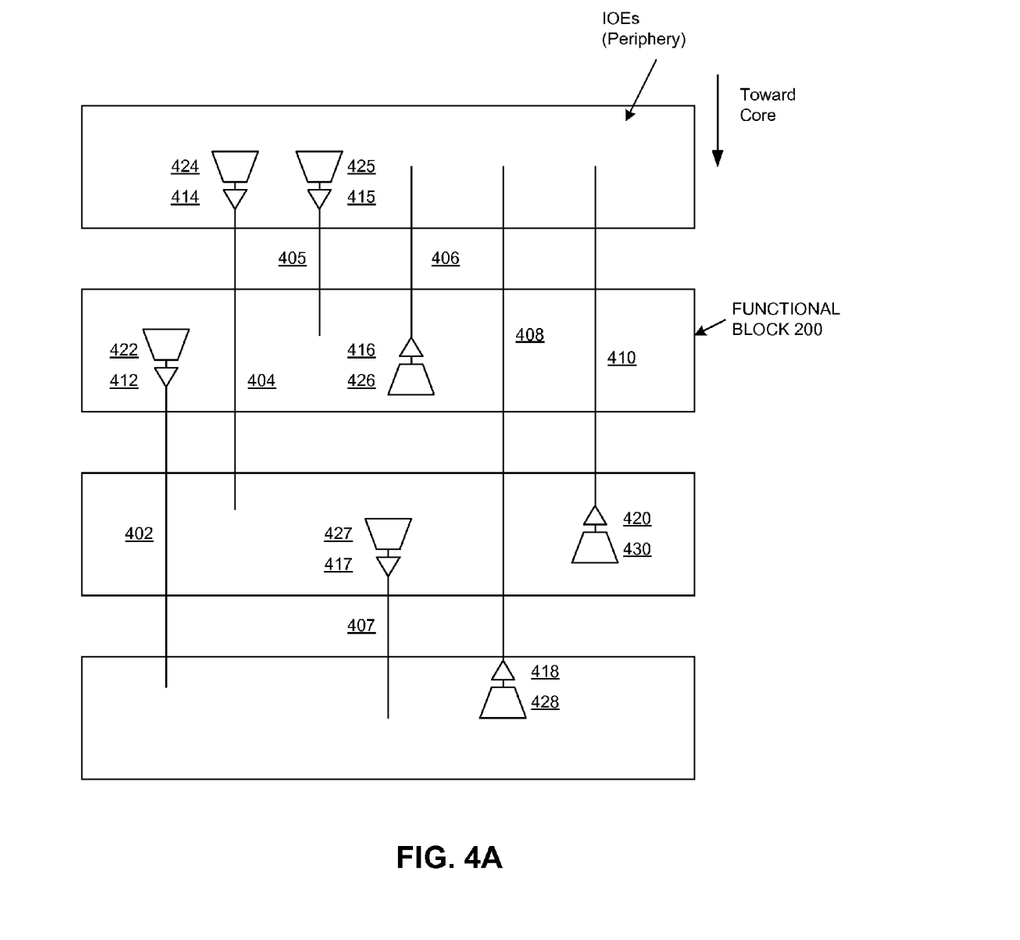
FIG. 4A is a block diagram illustrating an example of a routing architecture inside a functional block in embodiments according to the present invention.
Figure 4B:
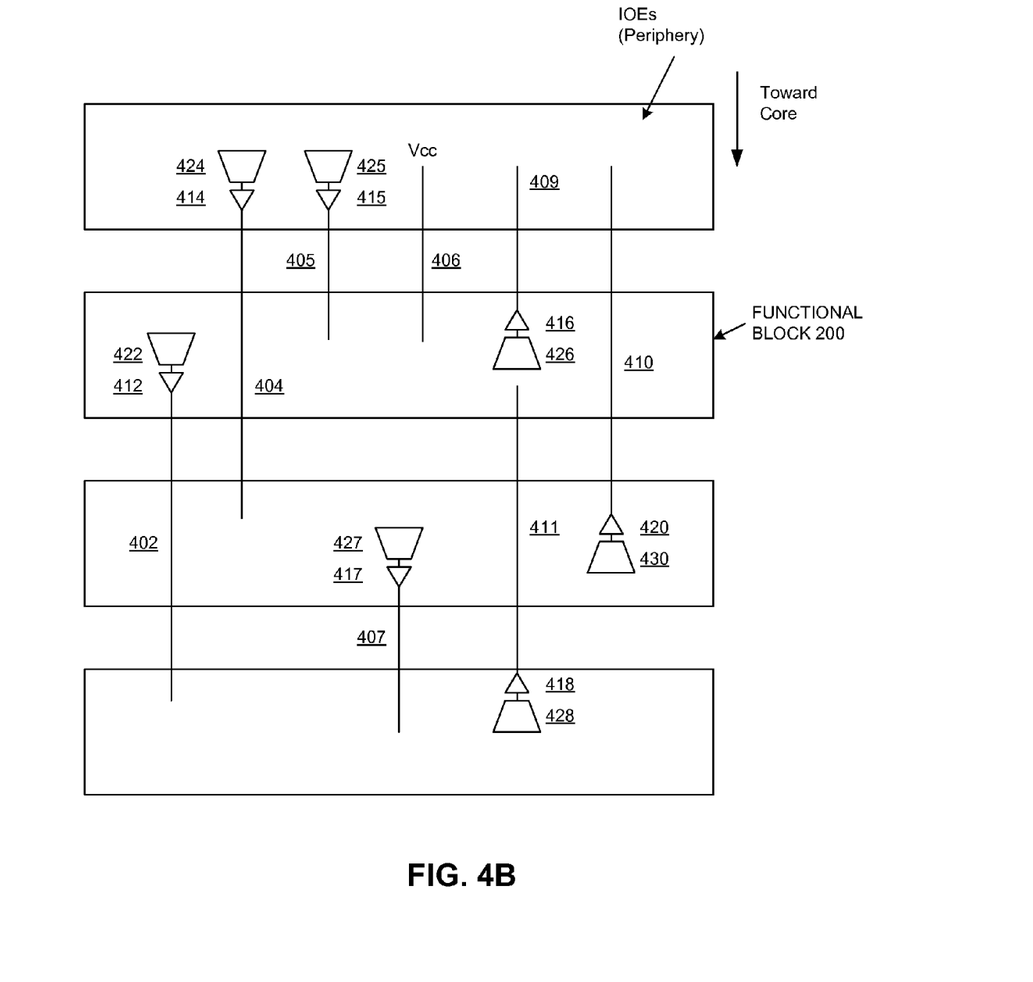
FIG. 4B is a block diagram illustrating a conventional routing architecture.
Figure 4C:
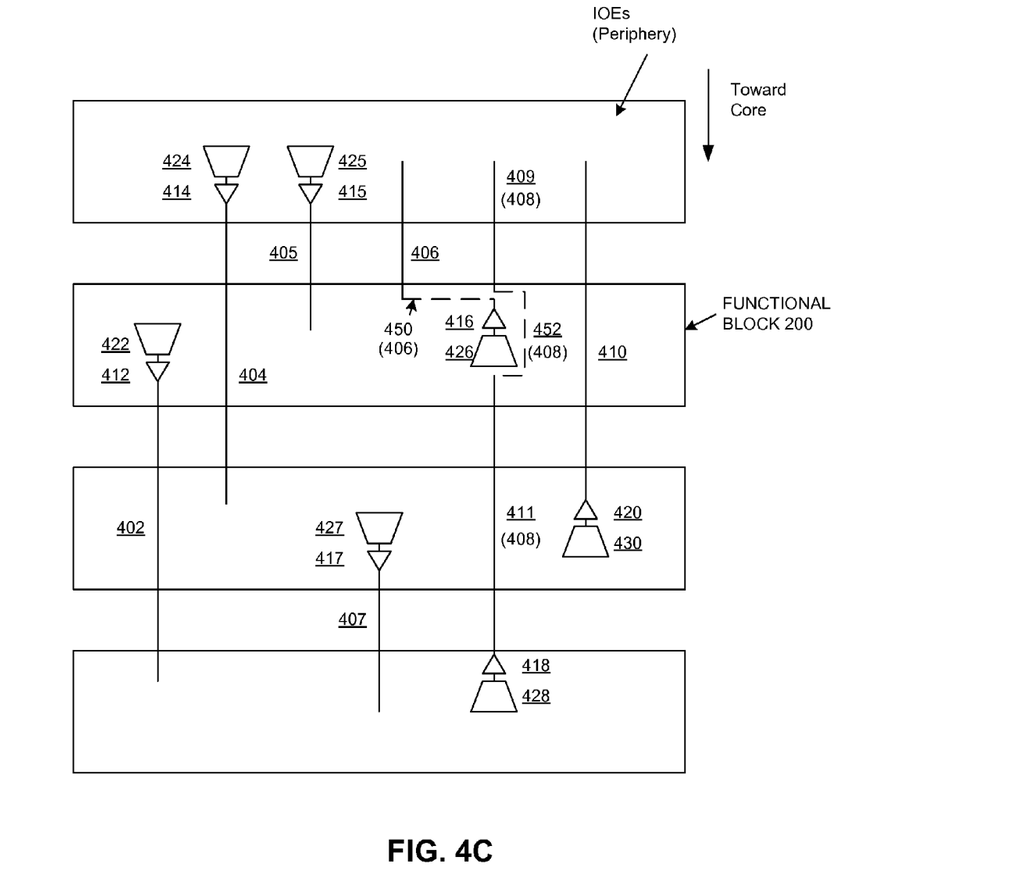
FIG. 4C is a block diagram illustrating adaption of the architecture of FIG. 4B to create the architecture of FIG. 4A.

FIG. 4A is a block diagram illustrating an example of a routing architecture inside the functional block 200 in embodiments according to the present invention. FIG. 4B is a block diagram illustrating a conventional routing architecture. FIG. 4C is a block diagram illustrating how the architecture of FIG. 4B is adapted to create the architecture of FIG. 4A.

Although FIGS. 4A, 4B, and 4C describe vertical conductors, the features about to be described can be readily applied to horizontal conductors to achieve similar benefits. Also, although the functional block 200 is shown as being adjacent to the periphery of the array of functional blocks, the present invention is not so limited; the functional block of interest may be located elsewhere in the array.

In FIG. 4A, each of the conductors 402, 404, 405, 406, 407, 408, and 410 can represent a plurality of conductors. Conductors 405, 406, and 407 are length-1 conductors, conductors 402, 404, and 410 are length-2 conductors, and conductor 408 is a length-3 conductor. Other lengths of conductors can be used, and other arrangements of conductors can be used. Also, only vertical conductors are illustrated; however, there can be horizontal conductors in addition to the vertical conductors.

Relative to the example of FIG. 3, for the functional block 200, the conductors represented by the conductor 402 correspond to the first plurality of conductors 301, the conductors represented by the conductor 404 correspond to the second plurality of conductors 302, the conductors represented by the conductor 406 correspond to the third plurality of conductors 303, and the conductors represented by the conductors 408 and 410 correspond to the fourth plurality of conductors 304.

In the embodiment of FIG. 4A, each of the conductors has an associated driver input multiplexer (DIM) and a driver (the drivers 412, 414, 415, 416, 417, 418, and 420, and the DIMs 422, 424, 425, 426, 427, 428, and 430). Each of the DIMs selects from any one of a variety of sources that can drive the associated conductor. That is, each of the DIMs receives multiple input signals and selects one of the signals to be driven on the associated conductor. The input signals into the DIMs are not shown in FIG. 4A; however, such an arrangement is well known in the art. The sources of input signals include, for example, signals that are received from other functional blocks in the vertical direction, signals generated by the functional block in which the DIM resides, and signals that are received from other functional blocks in the orthogonal (horizontal) direction.

Thus, each DIM has input connections from: 1) conductors that lie in the same (e.g., vertical) direction as the direction in which the DIM is pointing (e.g., conductors that deliver signals from a functional block above or below the functional block 200), which may be referred to as stitching connections; 2) conductors within the functional block 200 that are connected to the output of the functional block, which may be referred to as output connections; and 3) conductors that lie in the orthogonal direction relative to the direction in which the DIM is pointing (e.g., conductors that deliver signals from a functional block to the right or left of the functional block 200), which may be referred to as turning connections. The portion of the conductor that connects the input side of a DIM to a conductor is generally referred to as the listening stub, while the portion of the conductor that connects the driver at the output side of the DIM to a conductor is generally referred to as a driver stub.

In FIG. 4B, which represents a conventional routing architecture, identically numbered elements are the same as in FIG. 4A; however, some of the elements may be shown in different positions for clarity of illustration. In contrast to FIG. 4A, in the example of FIG. 4B, the conductor 406 is permanently driven to Vcc and cannot be used to route signals. Also, relative to the example of FIG. 4A, the architecture of FIG. 4B includes fewer conductors that can be used to route signals from the core to the periphery. Also, in FIG. 4B, the DIM 426 and the driver 416 are driving a length-1 conductor 409, and the DIM 428 and the driver 418 are driving a length-2 conductor 411.

In FIG. 4C, identically numbered elements are the same as in FIGS. 4A and 4B; however, some of the elements may be shown in different positions for clarity of illustration. As shown in FIG. 4C, the architecture of FIG. 4B is adapted to form the architecture of FIG. 4A by: 1) not connecting the conductor 406 to Vcc; 2) adding a driver stub 450 that allows the DIM 426 and the driver 416 to drive the conductor 406, and 3) adding a short conductor 452 that connects the conductors 409 and 411 to form the conductor 408 of FIG. 4A that is driven by the DIM 428 and the driver 418.

The architecture of FIG. 4A can be formed without significantly perturbing the fabrication process. The fabrication process remains essentially the same, except that mask patterns are changed so that the conductor 406 is not connected to Vcc, to form the driver stub 450, and to add the short conductor 452.

Thus, in embodiments according to the present invention, unnecessary (unused) conductors such as conductor 406 can be used to route signals from the core to the periphery. Thus, for example, the number of conductors that propagate signals in a direction toward the periphery of the functional block array is greater than the number of conductors that propagate signals in a direction away from the periphery. By using the unnecessary conductors to carry signals from the core to the periphery, the number of signals carried from the core to the periphery can be increased without increasing the size of the PLD and without adding conductors, multiplexers (e.g., DIMs), and/or drivers. Accordingly, costs remain about the same and may be reduced relative to other solutions. Furthermore, current fabrication processes can be used, perhaps without the need for additional stages, by modifying masks at the appropriate point(s) in the process.

Figure 5A:
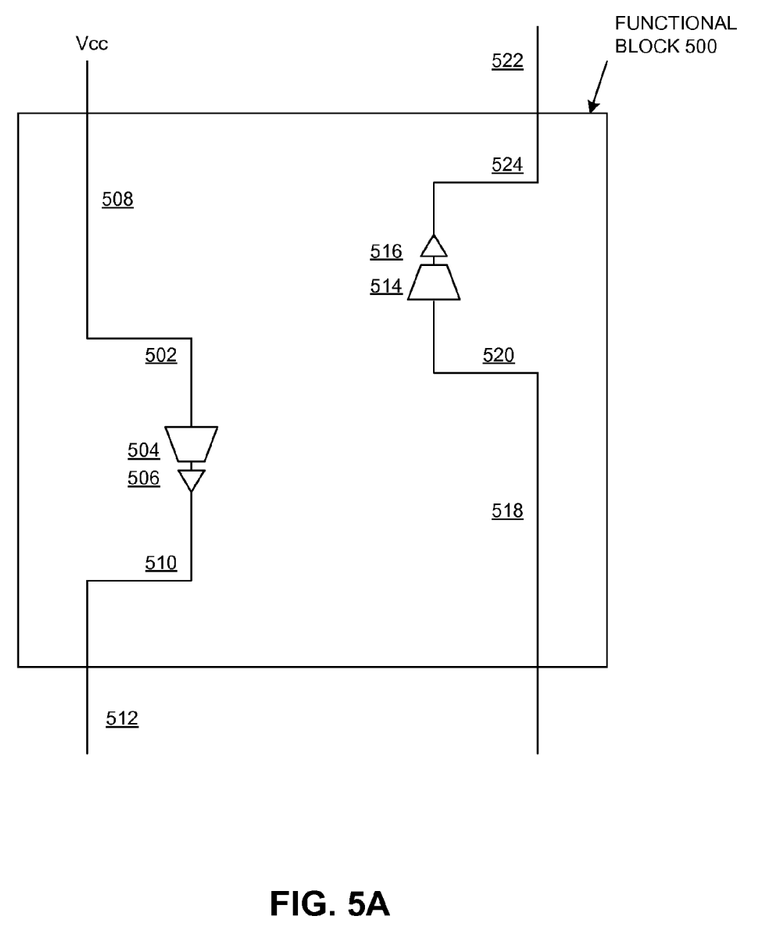
FIG. 5A is a block diagram illustrating a conventional routing architecture inside a functional block.
Figure 5B:
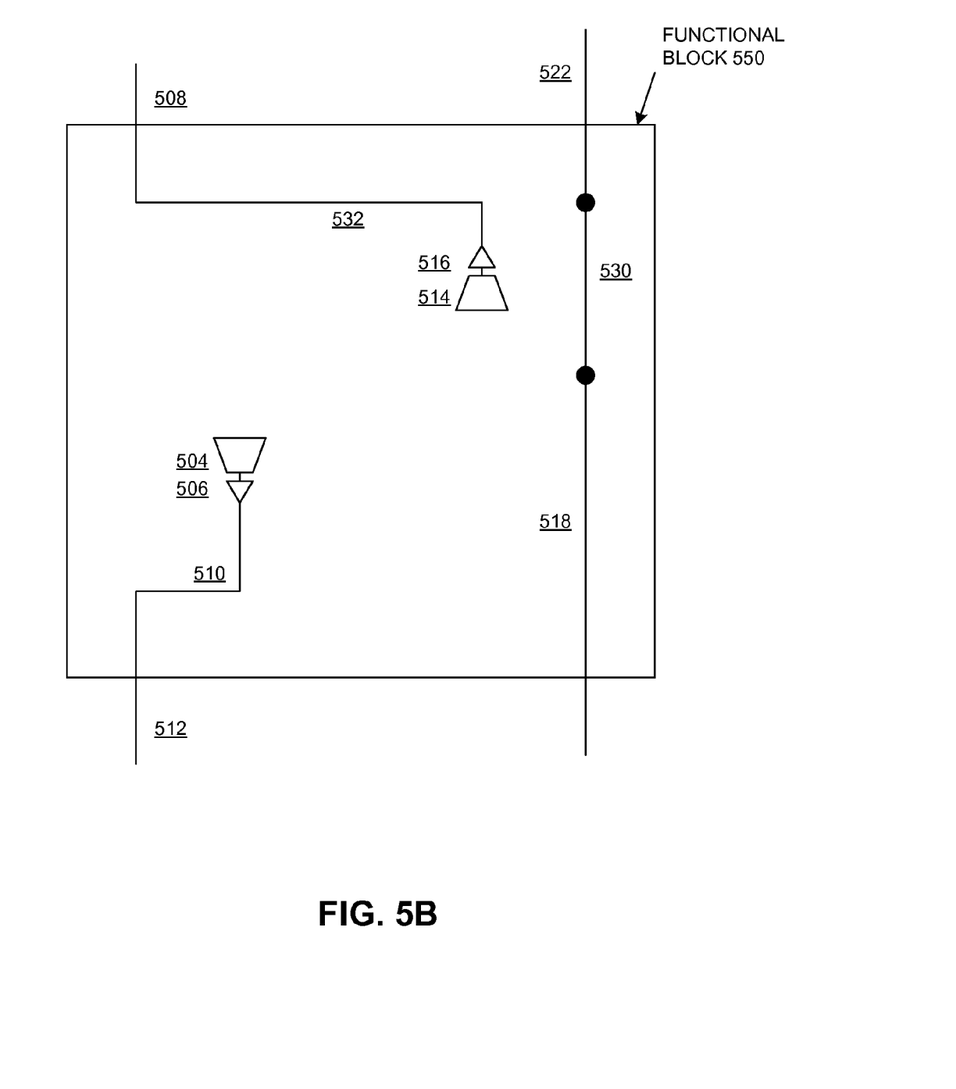
FIGS. 5B and 5C are block diagrams illustrating other examples of routing architectures inside a functional block in embodiments according to the present invention.
Figure 5C:
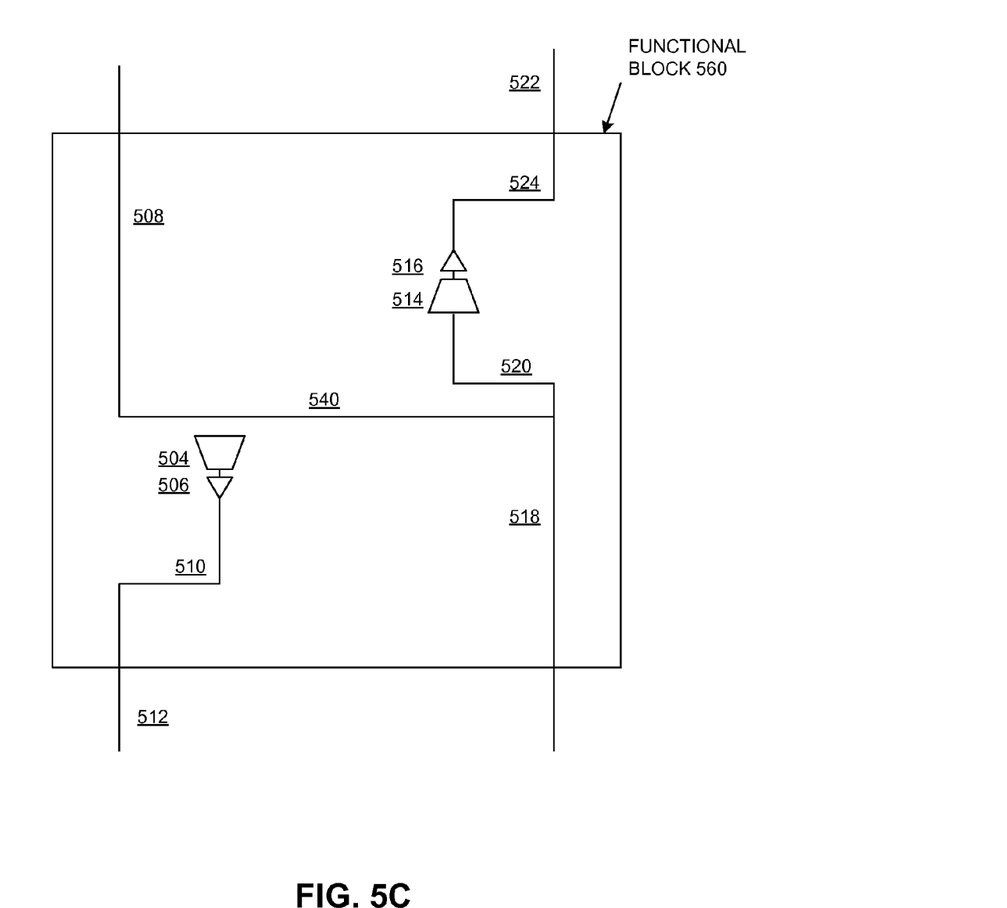

FIG. 5A is a block diagram illustrating a conventional routing architecture inside a functional block 500. FIGS. 5B and 5C are block diagrams illustrating other examples of routing architectures inside a functional block 550 and a functional block 560, respectively, in embodiments according to the present invention. The functional blocks 550 and 560 may be at a location that is at the periphery of an array of functional blocks or that is within such an array.

In FIG. 5A, a stitching connection drives an input of the multiplexer 504 to Vcc via conductor 508 and listening stub 502. The multiplexer 504 and driver 506 are also coupled to a driver stub 510 that connects them to a conductor 512. Also, a multiplexer 514 and driver 516 are connected to a conductor 518 via a listening stub 520, and to a conductor 522 via a driver stub 524.

In FIG. 5B, an input of the multiplexer 504 is no longer driven to Vcc, and can be used for an output connection to send signals to the core via the conductor 512. Also, the multiplexer 514 and the driver 516 are now connected to the conductor 508 via a driver stub 532, and can be used for an output connection to send signals to the periphery via the conductor 508. Moreover, the conductors 518 and 522 are now connected using the short conductor 530, forming a length-N conductor that can be used to carry signals uninterrupted through the functional block 550 from the core to the periphery.

The architecture of FIG. 5A can be adapted to form the architecture of FIG. 5B by: 1) not connecting the conductor 508 to Vcc; 2) not connecting the listening stub 520 and the driver stub 524, and instead connecting the conductors 518 and 522 using the short conductor 530; and 3) connecting the multiplexer 514 and driver 516 to the conductor 508 using the driver stub 532. As a result, the conductor that was conventionally driven to Vcc is advantageously replaced with a conductor that can carry signals from the core to the periphery. As such, an additional conductor from the core to the periphery is provided without having to increase the total number of conductors or increase the size of the PLD. As discussed above, the architecture of FIG. 5B can be formed without significantly perturbing the fabrication process, by changing mask patterns in the appropriate stage(s) of the fabrication process.

In FIG. 5C, an input of the multiplexer 504 is no longer driven to Vcc, and can be used for an output connection to send signals to the core via the conductor 512. The multiplexer 514 and the driver 516 remain connected to the conductors 518 and 522 via the listening stub 520 and the driver stub 524, respectively. Other inputs to the multiplexer 504 are not shown; those other inputs can include inputs from a functional block below the functional block 560 or to the left or right of the functional block. Thus, the multiplexer 514 and the driver 516 can be used for a stitching connection and/or a turning connection to deliver signals from the core to the periphery. Also, the conductor 518 is now connected to the conductor 508 via a short conductor 540, forming a length-N conductor that can be used to carry signals uninterrupted through the functional block 560 from the core to the periphery.

The architecture of FIG. 5A can be adapted to form the architecture of FIG. 5C by: 1) not connecting the conductor 508 to Vcc; and 2) connecting the conductor 508 to the conductor 518 using the short conductor 540. As a result, the conductor that was conventionally driven to Vcc is replaced with a conductor that can carry signals from the core to the periphery. As such, an additional conductor from the core to the periphery is advantageously provided without having to increase the total number of conductors or increase the size of the PLD. Also, as mentioned above, the architecture of FIG. 5C can be formed without significantly perturbing the fabrication process, by changing mask patterns in the appropriate stage(s) of the fabrication process.

Figure 6:
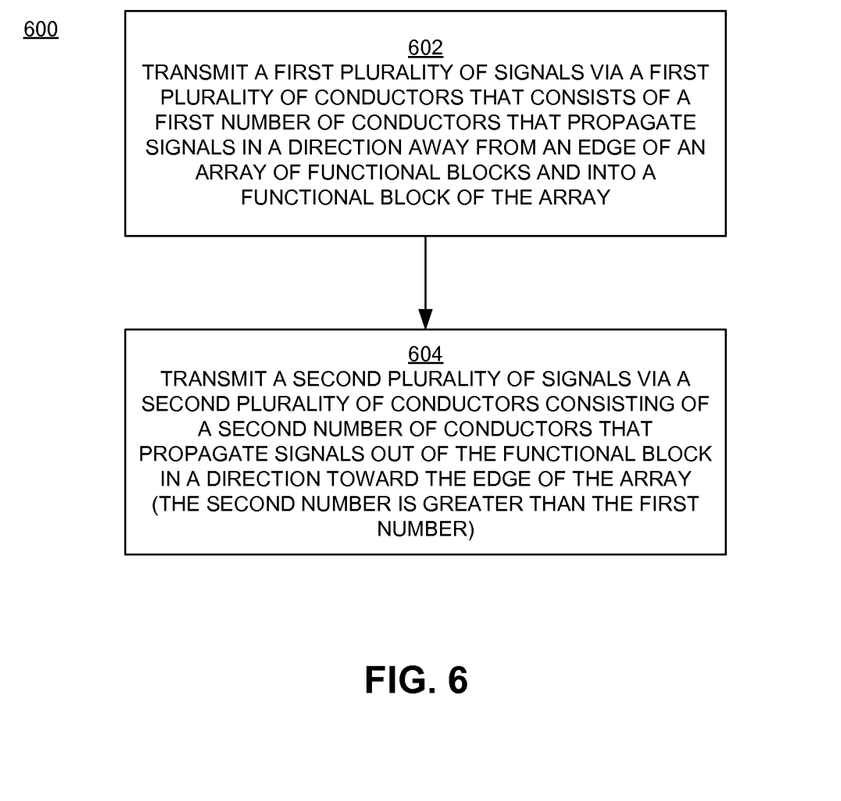
FIG. 6 is a flowchart of a method of routing signals in a programmable logic device in an embodiment according to the present invention.

FIG. 6 is a flowchart 600 of a method of routing signals in a programmable logic device in an embodiment according to the present invention. Although specific steps are disclosed in the flowchart 600, such steps are exemplary. That is, embodiments according to the present invention are well suited to performing various other steps or variations of the steps recited in the flowchart 600.

In block 602, a first plurality of signals can be transmitted via a first plurality of conductors that consists of a first number of conductors that propagate signals in a direction away from an edge of an array of functional blocks and into a first functional block of the array. The first plurality of conductors may include conductors that originate outside the first functional block and route signals to a multiplexer in the functional block, and conductors that originate outside the first functional block and conduct signals uninterrupted through the functional block to a second functional block of the array. The first plurality of conductors may also include conductors that originate inside the first functional block and that conduct signals away from the edge of the array.

In block 604, a second plurality of signals can be transmitted via a second plurality of conductors consisting of a second number of conductors that propagate signals out of the functional block in a direction toward the edge of the array. The second plurality of conductors may include conductors that originate inside the first functional block, and conductors that originate outside the first functional block and pass signals uninterrupted through the first functional block. The second plurality of conductors may also include conductors that originate outside the first functional block and that conduct signals toward the edge and into the first functional block. The second plurality of conductors can also include a conductor that originates outside the first functional block and branches into a first conductor branch and a second conductor branch inside the first functional block, wherein the first conductor branch conducts the signal into the first functional block and the second conductor branch conducts the signal uninterrupted through the first functional block.

Significantly, the second number is greater than the first number. That is, in embodiments according to the invention, the number of conductors available to transmit signals from the core of the array toward the periphery of the array is greater than the number of conductors available to transmit signals from the periphery to the core.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A programmable logic device comprising:
    an array of functional blocks;
    input/output elements disposed at a periphery of said programmable logic device; and
    a plurality of conductors configured to conduct signals between said array of functional blocks and further between said array of functional blocks and said input/output elements;
    wherein said plurality of conductors comprise a first plurality of said conductors that are available to propagate signals in a direction away from an edge of said programmable logic device and into said array, wherein said first plurality of conductors comprise continuous conductors that originate outside said first functional block and conduct uninterrupted signals through said first functional block to a second functional block of said array;
    wherein said plurality of conductors further comprise a second plurality of said conductors that are available to propagate signals out of said array in a direction toward said edge of said programmable logic device, wherein said second plurality of conductors comprise continuous conductors that originate outside said first functional block and pass uninterrupted signals through said first functional block; and
    wherein the total number of said conductors that propagate signals out of said array is greater than the total number of said conductors that propagate signals into said array.

2. The programmable logic device of claim 1 wherein said first plurality of conductors further comprise conductors that originate outside a first functional block of said array and route signals to a multiplexer in said first functional block.

3. The programmable logic device of claim 1 wherein said second plurality of conductors further comprise conductors that originate inside a first functional block of said array.

4. The programmable logic device of claim 1 wherein said plurality of conductors further comprises:
    conductors that originate outside a first functional block of said array and that conduct signals toward said edge of said programmable logic device and into said first functional block; and
    conductors that originate inside said first functional block and conduct signals out of said first functional block in a direction away from said edge of said programmable logic device.

5. The programmable logic device of claim 1 wherein said functional blocks comprise a first functional block that is adjacent to an input/output element at said periphery of said programmable logic device, wherein said first plurality of conductors further comprise conductors that originate in said input/output element and conduct signals into said first functional block; and wherein said second plurality of conductors further comprise conductors that originate in said functional block and conduct signals from said first functional block to said input/output element.

6. The programmable logic device of claim 1 wherein said second plurality of conductors comprises a conductor that originates outside a first functional block and branches into a first conductor branch and a second conductor branch inside said first functional block, wherein said first conductor branch conducts a signal into said first functional block and said second conductor branch conducts said signal as an uninterrupted signal through said first functional block.

7. A method of routing signals in a programmable logic device comprising an array of functional blocks and also comprising a plurality of conductors configured to conduct signals between said array of functional blocks and input/output elements at a periphery of said programmable logic device, said method comprising:
    transmitting a first plurality of signals via a first plurality of said conductors that propagate signals in a direction away from an edge of said programmable logic device and into a first functional block of said array; and
    transmitting a second plurality of signals via a second plurality of said conductors that propagate signals out of said first functional block in a direction toward said edge of said programmable logic device,
    wherein the total number of said conductors that propagate uninterrupted signals out of said array from said functional blocks to said input/output elements is greater than the total number of said conductors that propagate uninterrupted signals into said array from said input/output elements to said functional blocks.

8. The method of claim 7 wherein said transmitting said first plurality of signals further comprises transmitting said first plurality of said signals via conductors selected from the group consisting of: conductors that originate outside said first functional block and route signals to a multiplexer in said first functional block, and continuous conductors that originate outside said first functional block and conduct uninterrupted signals through said first functional block to a second functional block of said array.

9. The method of claim 7 wherein said transmitting said second plurality of signals further comprises transmitting said second plurality of said signals via conductors selected from the group consisting of: conductors that originate inside said first functional block, and continuous conductors that originate outside said first functional block and pass uninterrupted signals through said first functional block.

10. The method of claim 7 wherein said transmitting said first plurality of signals further comprises transmitting said first plurality of said signals via conductors that originate inside said first functional block and that conduct signals away from said edge of said programmable logic device.

11. The method of claim 7 wherein said transmitting said second plurality of signals further comprises transmitting said second plurality of said signals via conductors that originate outside said first functional block and that conduct signals toward said edge of said programmable logic device and into said first functional block.

12. The method of claim 7 wherein said first functional block is adjacent to an input/output element.

13. The method of claim 12 wherein said first plurality of conductors are selected from the group consisting of: conductors that originate in said input/output element and conduct signals into said first functional block, and continuous conductors that originate in said input/output element and conduct uninterrupted signals through said first functional block; and wherein said second plurality of conductors are selected from the group consisting of: conductors that originate in said first functional block and conduct signals from said first functional block to said input/output element, and continuous conductors that originate outside said first functional block and that conduct uninterrupted signals through said functional block to said input/output element.

14. The method of claim 7 further comprising transmitting a signal via a conductor that originates outside said first functional block and branches into a first conductor branch and a second conductor branch inside said first functional block, wherein said first conductor branch conducts said signal into said first functional block and said second conductor branch conducts said signal as an uninterrupted signal through said first functional block.

15. A programmable logic device comprising:
an array of functional blocks; and
a plurality of conductors configured to conduct signals between said functional blocks and also between said functional blocks and input/output elements disposed outside said array;
wherein said plurality of conductors comprise a first plurality of said conductors comprising conductors that propagate signals in a direction away from an edge of said array and into said array, wherein said first plurality of conductors comprise continuous conductors that originate outside said first functional block and conduct uninterrupted signals through said first functional block to a second functional block of said array;
wherein said plurality of conductors further comprise a second plurality of said conductors that propagate signals out of said array in a direction toward said edge, wherein said second plurality of conductors comprise conductors that originate outside said first functional block and pass signals uninterrupted through said first functional block; and
wherein said continuous conductors comprise a continuous track of metal not separated into segments by an intervening element and wherein said uninterrupted signals are not acted upon by an intervening element on said continuous conductors, wherein the total number of said conductors that propagate uninterrupted signals out of said array from said functional blocks to said input/output elements is greater than the total number of said conductors that propagate uninterrupted signals into said array from said input/output elements to said functional blocks.

16. The programmable logic device of claim 15 wherein said first plurality of conductors further comprise conductors that originate outside a first functional block of said array and route signals to a multiplexer in said first functional block.

17. The programmable logic device of claim 15 wherein said second plurality of conductors further comprise conductors that originate inside a first functional block of said array.

18. The programmable logic device of claim 15 wherein said plurality of conductors further comprises:
conductors that originate outside a first functional block of said array and that conduct signals toward said edge and into said first functional block; and
conductors that originate inside said first functional block and conduct signals out of said first functional block in a direction away from said edge.

19. The programmable logic device of claim 15 wherein said functional blocks comprise a first functional block that is adjacent to an input/output element at said edge, wherein said first plurality of conductors further comprise conductors that originate in said input/output element and conduct signals into said first functional block; and wherein said second plurality of conductors further comprise conductors that originate in said first functional block and conduct signals from said first functional block to said input/output element.

20. The programmable logic device of claim 15 wherein said second plurality of conductors comprises a conductor that originates outside a first functional block and branches into a first conductor branch and a second conductor branch inside said first functional block, wherein said first conductor branch conducts a signal into said first functional block and said second conductor branch conducts said signal as an uninterrupted signal through said first functional block.

\* \* \* \* \*